(12) United States Patent
Shiobara

(10) Patent No.: US 7,825,702 B2
(45) Date of Patent: Nov. 2, 2010

(54) SYNTHESIZER MODULE

(75) Inventor: Tsuyoshi Shiobara, Chitose (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 12/318,785

(22) Filed: Jan. 8, 2009

(65) Prior Publication Data

US 2009/0128197 A1 May 21, 2009

Related U.S. Application Data

(63) Continuation of application No. PCT/JP2007/071205, filed on Oct. 31, 2007.

(30) Foreign Application Priority Data

Nov. 8, 2006 (JP) ............................ P2006-302269

(51) Int. Cl.
 H03B 21/00 (2006.01)
(52) U.S. Cl. .................... 327/105; 327/106; 327/107
(58) Field of Classification Search ......... 327/105–107; 455/165.1, 180.3, 183.1, 183.2, 185.1, 260
 See application file for complete search history.

(56) References Cited

U.S. PATENT DOCUMENTS

| | | | | |
|---|---|---|---|---|
| 3,962,644 A | * | 6/1976 | Baker | ...................... 455/154.2 |
| 4,298,989 A | * | 11/1981 | Someno et al. | ........... 455/183.2 |
| 4,302,778 A | * | 11/1981 | Tanaka | ........................ 348/735 |
| 4,510,623 A | * | 4/1985 | Bonneau et al. | ................ 725/27 |
| 4,545,072 A | * | 10/1985 | Skutta et al. | ............. 455/183.2 |
| 4,551,856 A | * | 11/1985 | Victor et al. | .............. 455/183.2 |
| 4,679,246 A | * | 7/1987 | Jeng | ......................... 455/183.2 |
| 4,727,591 A | * | 2/1988 | Manlove | ................... 455/182.2 |
| 5,678,211 A | * | 10/1997 | Badger | ..................... 455/191.1 |
| 7,415,247 B1 | * | 8/2008 | Vaisanen et al. | .............. 455/76 |

FOREIGN PATENT DOCUMENTS

| | | |
|---|---|---|
| JP | 05-041664 | 2/1993 |
| JP | 05-122064 | 5/1993 |
| JP | 08-340254 | 12/1996 |
| JP | 10-191314 | 7/1998 |
| JP | 10-322252 | 12/1998 |
| JP | 2000-286731 | 10/2000 |
| JP | 2000-307458 | 11/2000 |
| JP | 2006-005489 | 1/2006 |

OTHER PUBLICATIONS

Systec Research Inc. "UHF Band Frequency Synthesizer for SFN & MFN of Digital TV Broadcasting Model: DCN-SP501/801-Bxx" (Nov. 2005).

* cited by examiner

Primary Examiner—Kenneth B. Wells
(74) Attorney, Agent, or Firm—Jacobson Holman PLLC

(57) ABSTRACT

To provide a synthesizer module that can be used not only in a destination area but also in the whole world and that can be readily set in output frequency. In the synthesizer module, a calculation formula table of a nonvolatile memory stores a plurality of frequency modes and the calculation formula of carrier frequencies corresponding to those frequency modes, and further stores, in its certain area, a frequency mode set during an initial setting of the device. A CPU, when receiving a channel number from a rotary SW during a frequency setting, calculates, based on a calculation formula corresponding to a currently set frequency mode, a carrier frequency corresponding to the channel number. This carrier frequency is set to a CONT of a PLL part.

4 Claims, 4 Drawing Sheets

FIG.2

| CHANNEL FREQUENCY MODE | MODE 1 | MODE 2 | MODE 3 | MODE 4 |
|---|---|---|---|---|
| CHANNEL EFFECTIVE RANGE | n=13~62 | n=13~62 | n=14~83 | n=13~68 |
| FREQUENCY CALCULATION FORMULAE | 395+(1/7)+6n [MHz] | 395+(1/7)+6n +37.15 [MHz] | 389+6n [MHz] | (n=13~24): 370+8n [MHz] (n=25~68): 410+8n [MHz] |

FIG.3

| FREQUENCY MODE / CHANNEL NUMBER | MODE 1 CENTER FREQUENCY [Hz] | MODE 2 CENTER FREQUENCY [Hz] | MODE 3 CENTER FREQUENCY [Hz] | MODE 4 CENTER FREQUENCY [Hz] |
|---|---|---|---|---|
| 13 ch | xxx.xxx.xxx.x | xxx.xxx.xxx.x | — | xxx.xxx.xxx.x |
| 14 ch | xxx.xxx.xxx.x | xxx.xxx.xxx.x | xxx.xxx.xxx.x | xxx.xxx.xxx.x |
| 15 ch | xxx.xxx.xxx.x | xxx.xxx.xxx.x | xxx.xxx.xxx.x | xxx.xxx.xxx.x |
| 62 ch | xxx.xxx.xxx.x | xxx.xxx.xxx.x | xxx.xxx.xxx.x | xxx.xxx.xxx.x |
| 63 ch | — | — | xxx.xxx.xxx.x | xxx.xxx.xxx.x |
| 68 ch | — | — | xxx.xxx.xxx.x | xxx.xxx.xxx.x |
| 69 ch | — | — | xxx.xxx.xxx.x | — |
| 83 ch | — | — | xxx.xxx.xxx.x | — |

SYNTHESIZER MODULE

This is a Continuation of PCT/JP2007/071205 filed Oct. 31, 2007 and published in Japanese.

BACKGROUND OF THE INVENTION

1. Field of the Invention

The present invention relates to a frequency synthesizer module for digital terrestrial broadcasting, and more particularly, to a synthesizer module which can easily set an adequate oscillation frequency according to an area with common specifications, regardless of a destination area.

2. Description of the Related Art

[Description of Prior Art]

A conventional synthesizer module for digital terrestrial broadcasting separates every channel range into several bands, selects a channel number in a band with a digital switch, and sets an oscillation frequency (see Non-patent Document 1).

However, while the above frequency setting approach can cope with the setting only for a limited destination area where channel frequencies are arranged at fixed frequency intervals as in Japan, a synthesizer module for common worldwide use is demanded to have specifications that can permit frequency setting in 1-Hz step.

A synthesizer module compatible with all bands in 1-Hz step has been developed and provided (see Non-patent Document 2).

The prior arts that disclose the setting of the channel of a frequency synthesizer include those in Japanese Laid-Open Patent Application publication H10 (1998)-322252 (Patent Document 1), Japanese Laid-Open Patent Application publication H05 (1993)-041664 (Patent Document 2), Japanese Laid-Open Patent Application publication H08 (1996)-340254 (Patent Document 3), and Japanese Laid-Open Patent Application publication 2000-307458 (Patent Document 4).

Patent Document 1 describes such a configuration of a frequency synthesizer that a parameter or so on corresponding to a group setting mode is read from a memory, and an arbitrary frequency can be set by means of a switch or the like.

Patent Document 2 describes such a configuration of a frequency synthesizer that a predetermined frequency can be set using a program divider.

Further, patent Document 3 describes a frequency synthesizer having such a configuration that a frequency setting parameter is read from a memory, and an arbitrary frequency which is equal to or less than a half of an input lock frequency can be set.

Patent Document 4 describes such a configuration of a PLL incorporated tuner that a band and the center frequency of an intermediate frequency can be arbitrarily set by data control.

Patent Document 1: Japanese Laid-open Patent Application Publication H10(1998)-322252

Patent Document 2: Japanese Laid-open Patent Application Publication H05(1993)-041664

Patent Document 3: Japanese Laid-open Patent Application Publication H08(1996)-340254

Patent Document 4: Japanese Laid-open Patent Application Publication 2000-307458

Non-patent Document 1: SYSTEC RESEARCH Inc., "UHF Band Frequency Synthesizer for SFN & MFN of Digital TV Broadcasting Model: DCN-SP501/801-Bxx" November 2005 http://www.systec-r.com/pdf/dcn-sp501j.pdf Non-patent Document 2: SYSTEC RESEARCH Inc., "UHF Band Frequency Synthesizer Model: DTV-2000N" September 2005 http://www.systec-r.com/pdf/dtv2000nj.pdf While there are the above-described two conventional setting approaches, however, a problem arises such that simple integration of both approaches alone cannot easily set an oscillation frequency in view of the convenience of a frequency setting person.

SUMMARY OF THE INVENTION

The present invention has been made in view of the foregoing situations, and it is an object of the present invention to provide a frequency synthesizer module which can be commonly used worldwide regardless of a destination area, and can easily set an output frequency.

To achieve the object, in accordance with the present invention, there is provided a synthesizer module including a reference clock oscillation circuit configured to generate a reference clock, a voltage controlled oscillator, an amplifier which amplifies an output from the voltage controlled oscillator, a control section configured to generate a signal of a frequency set based on the reference clock, compare a phase of the generated signal of the set frequency with a phase of a signal input from the voltage controlled oscillator, and output a phase difference signal as a voltage value to the voltage controlled oscillator, a switch configured to set a channel number, and a central processing unit configured to output information on a frequency to be set to the control section, wherein the synthesizer module further includes a memory configured to store a frequency mode selected from outside, and wherein the central processing unit reads the selected frequency mode stored in the memory and a frequency calculation formula corresponding to said frequency mode, calculates a value of a frequency corresponding to the channel number set by the switch based on the frequency calculation formula, and outputs the value to the control section. This brings about an effect such that if the frequency mode of a destination area is set in the memory, merely an operation of setting a channel number can permit a frequency corresponding to the channel number to be calculated based on an adequate calculation formula, and to be set in the control section, so that an adequate frequency can be output with common specifications to every equipment, regardless of a destination area, thus making it possible to realize reduction in the cost of equipment as well as easy operation for a frequency setting.

Further, in accordance with the present invention, in the above-described synthesizer module, the memory stores a value of a specific frequency, and the central processing unit determines whether or not the channel number set by the switch falls within an effective range of a channel number corresponding to the selected frequency mode stored in the memory, reads, when the channel number deviates from the effective range, the value of the specific frequency from the memory and outputs the value to the control section, and reads, when the channel number is within the effective range, the selected frequency mode stored in the memory and a frequency calculation formula corresponding to the frequency mode, to calculate a value of the frequency corresponding to the channel number set by the switch based on the frequency calculation formula, and outputs the value to the control section. Therefore, such an effect is brings about that even if a wrong channel number is set by the switch, the standard frequency in that selected frequency mode can be set.

Further, in accordance with the present invention, in the above-described synthesizer module, the central processing unit stores a value of a specific frequency and further, said central processing unit determines whether or not the channel number set by the switch falls within an effective range of a channel number corresponding to the selected frequency mode stored in the memory, outputs, when the channel number deviates from the effective range, a value of the specific frequency to the control section, and reads, when the channel number is within the effective range, the selected frequency mode stored in the memory and a frequency calculation formula corresponding to the frequency mode, to calculate a value of the frequency corresponding to the channel number set by the switch based on the frequency calculation formula, and outputs the value to the control section. This brings about, therefore, an effect such that even when a wrong channel number is set by the switch, the standard frequency in that selected frequency mode can be set.

Further, in accordance with the present invention, there is provided a synthesizer module including a reference clock oscillation circuit configured to generate a reference clock, a voltage controlled oscillator, an amplifier which amplifies an output from the voltage controlled oscillator, a control section configured to generate a signal of a frequency set based on the reference clock, compare a phase of the generated signal of the set frequency with that of a signal input from the voltage controlled oscillator, and output a phase difference signal as a voltage value to the voltage controlled oscillator, a switch configured to set a channel number, and a central processing unit configured to output information on a frequency to be set to the control section, wherein the synthesizer module further includes a table configured to store a channel number and a value of a frequency corresponding thereto, and a memory configured to store a frequency mode selected from outside, for each of frequency modes of a plurality of channels, and wherein the central processing unit reads the selected frequency mode from the memory, determines whether or not the channel number falls within an effective range of a channel number corresponding to the selected frequency mode stored in the memory, and retrieves, when the channel number is within the effective range, the table based on the frequency mode and the channel number to obtain a value of a corresponding frequency, and outputs the value to the control section. Therefore, such an effect is brought about that if the frequency mode of a destination area is set in the memory, a mere operation to set a channel number enables to read out a frequency corresponding to the channel number and to set the frequency in the control section, so that an adequate frequency can be output with specifications common to every equipment, irrespective of a destination area, thus making it possible to achieve reduction in the equipment cost as well as easy operation for a frequency setting.

Further, in accordance with the invention, in the above-described synthesizer module, the memory stores a value of a specific frequency, and the central processing unit determines whether or not the channel number set by the switch falls within an effective range of a channel number corresponding to the selected frequency mode stored in the memory, and reads, when the channel number is out of the effective range, the value of the specific frequency from the memory to output the value to the control section. Therefore, such an effect is brings about that even if a wrong channel number is set by the switch, the standard frequency in that selected frequency mode can be set.

Further, in accordance with the invention, in the above-described synthesizer module, the central processing unit stores a value of a specific frequency, and further said central processing unit determines whether or not the channel number set by the switch falls within an effective range of a channel number corresponding to the selected frequency mode stored in the memory, and outputs, when the channel number deviates from the effective range, a value of the specific frequency to the control section. This brings about, therefore, an effect such that even when a wrong channel number is set by the switch, the standard frequency in that selected frequency mode can be set.

BRIEF DESCRIPTION OF THE DRAWINGS

FIG. 2 is a diagrammatic view illustrating and explaining the structure of a formula table.

FIG. 3 is a diagrammatic view illustrating an example of the structure of a carrier frequency table.

<DESCRIPTION OF REFERENCE NUMERALS>

1 ... reference clock source, 2 ... CONT (PLL), 3 ... VCO, 4 ... AMP, 10 ... CPU, 11 ... rotary switch, 12 ... nonvolatile memory, 13 ... serial bus, 20 ... external control apparatus

DETAILED DESCRIPTION OF THE PREFERRED EMBODIMENT

[Outline of the Invention]

An embodiment of the present invention will be described with reference to the accompanying drawings.

In a synthesizer module according to the embodiment of the present invention, a plurality of frequency modes and formulae for calculating carrier frequencies from channel numbers in correspondence to the frequency modes are preliminarily stored in a nonvolatile memory, and when a channel number is set with a digital switch, a CPU calculates a carrier frequency corresponding to the channel number based on the formula corresponding to the frequency mode which has selected by means of a control terminal at the time of setting, and sets the frequency in a PLL section, and if a frequency mode corresponding to an area of usage is set at the time of initialization, an adequate carrier frequency according to an area of usage in every part of the world can be output as soon as an operator merely sets a channel number at a site using a digital switch, thereby making it possible to easily execute frequency setting.

The Configuration of Embodiment

FIG. 1

Figure 1:
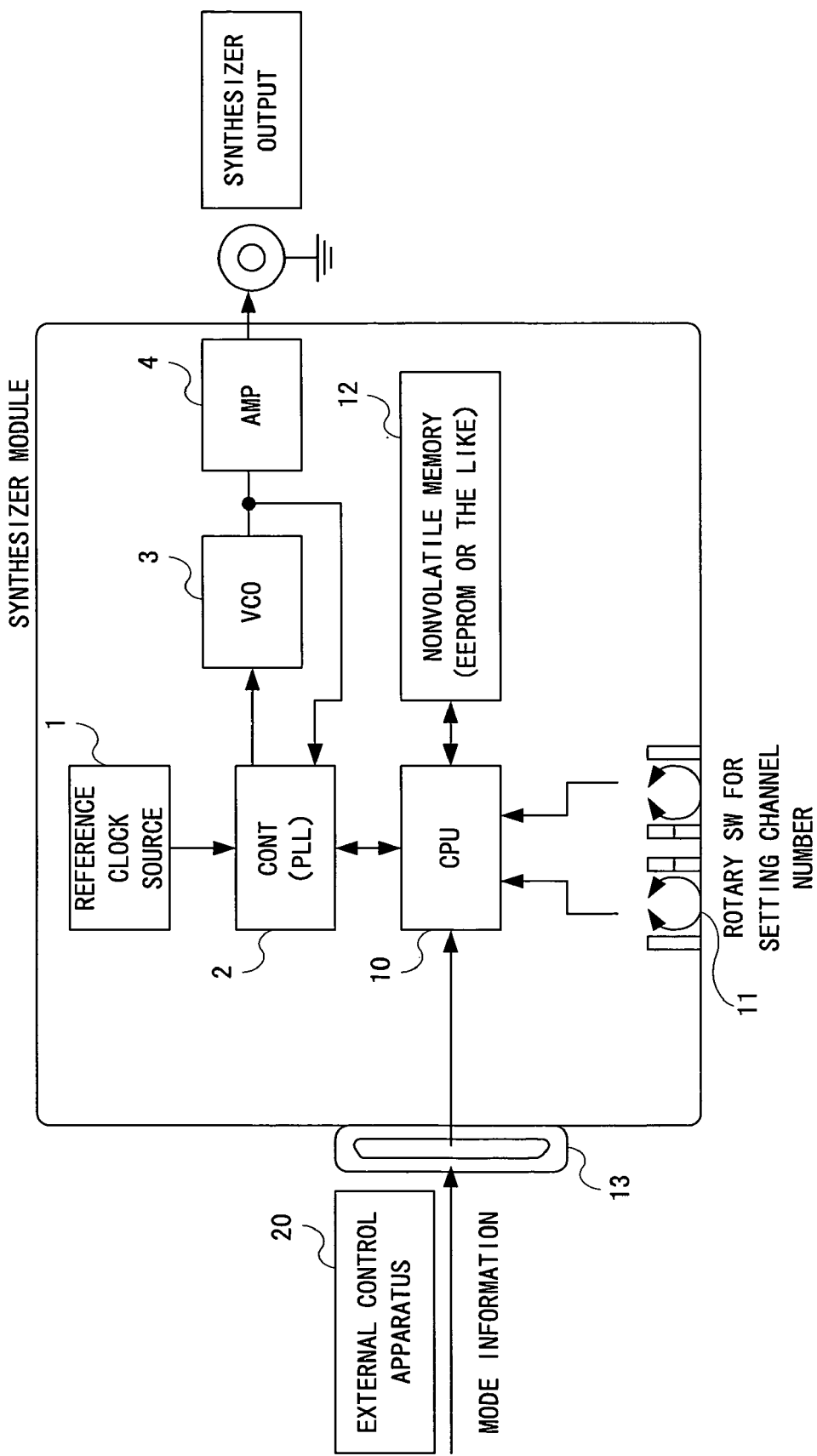
FIG. 1 is a block diagram illustrating a configuration of a synthesizer module according to an embodiment of the present invention.

FIG. 1 is a block diagram to illustrate the configuration of the synthesizer module according to the embodiment of the present invention.

The synthesizer module according to the embodiment of the invention (the present synthesizer module), as shown in FIG. 1, includes a reference clock source (reference clock oscillation circuit) 1, a control section (CONT) 2 using a PLL (Phase Locked Loop), a voltage controlled oscillator (VCO)

3, an amplifier (AMP) 4, a central processing unit (CPU) 10, a rotary switch (SW) 11, a nonvolatile memory 12, and a serial bus 13.

The reference clock source 1 oscillates a clock of a reference period to output it to the CONT 2.

The CONT (PLL) 2 is the control section of the synthesizer part, which generates a signal of a frequency to be set by the CPU 10 by frequency-dividing a signal from the reference clock source 1, compares the phase of the generated signal of the set frequency with that of a signal inputted from the VCO 3, and outputs a phase difference signal as a voltage value to the VCO 3.

The VCO 3 performs adjustment to change the oscillation frequency according to the voltage value inputted from the CONT 2, and sends the output to the AMP 4 and the CONT 2.

The AMP 4 amplifies the output from the VCO 3 to provide therefrom a synthesis output.

The reference clock source 1, the CONT 2, the VCO 3 and the AMP 4 are the basic constituents for the configuration of a synthesizer. With the present synthesizer module, it is possible to output the frequency set by the CPU 10 at every 1-Hz step.

The CPU 10 stores thereinside a processing program, and executes processes according to the stored processing program. The processes will be described later.

As a feature of the present synthesizer module, the CPU 10 calculates a carrier frequency corresponding to a channel (CH) number according to a frequency mode set in the nonvolatile memory 12 and the setting of the CH number from the rotary SW 11, and sets the frequency in the CONT 2.

The rotary SW 11 is a digital switch which sets a CH number of two digits. Alternatively, any input section capable of setting a CH number, for example, a dip switch or the like, may be employed instead of the rotary SW 11, and thus, the input section is not restricted to the rotary SW. Normally, an operator at a setting site operates the switch at the time of setting a frequency.

The nonvolatile memory 12 constitutes a characteristic part of the present synthesizer module, is configured of an EEPROM or the like, and has a formula table that stores carrier frequency calculation formulae corresponding to a plurality of frequency modes. The formula table will be described later.

The nonvolatile memory 12 stores a frequency mode set from an external control apparatus 20 in a specific area at the time of setting various parameters prior to the usage of the present synthesizer module.

Further, the nonvolatile memory 12 stores a preset specific frequency and the value of a frequency set at the previous time as a default frequency. The default frequency is the value of a frequency to be outputted to the CONT 2 by the CPU 10 when the channel number set by the rotary SW 11 deviates from a valid range. The default frequency may be stored for each frequency mode, or may be stored not in the nonvolatile memory but in the CPU 10.

The serial bus 13 receives frequency mode information ("mode information" in the diagram) from the external control apparatus 20 in the form of a serial signal, and outputs the information to the CPU 10.

The external control apparatus 20 is provided to output the frequency mode information to the serial bus 13 in the form of a serial signal.

[The Configuration of Calculation Table FIG. 2]

The formula table stored in the nonvolatile memory 12 will be described referring to FIG. 2. FIG. 2 is an exemplary diagram showing and explaining the configuration of the formula table.

As shown in FIG. 2, the formula table stores a plurality of frequency modes (or destination codes), corresponding channel valid ranges, and corresponding frequency calculation formulae. A frequency mode is a parameter that is used for specifying a combination of a channel number and a carrier frequency.

In the example of the present synthesizer module, four frequency modes, "mode 1", "mode 2", "mode 3", and "mode 4" are provided. Instead of a frequency mode, an identification number or a destination code, which corresponds thereto, may be stored.

The channel effective range is a range of channels which are available according to each frequency mode. For example, 13 to 62 channels are available in "mode 1", and 14 to 83 channels are available in "mode 3".

Then, the channel effective range is used at the time when the CPU 10 determines whether or not the channel number is effective when a channel number ha is set by the rotary SW 11.

A frequency calculation formula is a formula for calculating a carrier frequency according to each frequency mode from the set channel number.

In the present synthesizer module, the CPU 10, when activated, reads a frequency mode set at the time of setting a parameter, and a frequency calculation formula corresponding thereto from the nonvolatile memory 12, and calculates a carrier frequency by substituting the channel number set by the rotary SW 11 into the formula.

While the formula table is stored in the nonvolatile memory 12 in the present synthesizer module, necessary formulae may be retained in the processing program in the CPU 10.

[The Carrier Frequency Table FIG. 3]

When a carrier frequency cannot be expressed by a simple formula based on a channel number, a channel number and a carrier frequency corresponding thereto may be stored as a frequency table for every frequency mode.

FIG. 3 is a diagrammatic view showing and explaining an example of the configuration of the carrier frequency table.

As shown in FIG. 3, the values of carrier frequencies corresponding to channel numbers in the effective range are specifically stored in the carrier frequency table for each frequency mode. Then, the CPU 10 reads a carrier frequency corresponding to the channel number set by the rotary SW 11 by referring to the carrier frequency table corresponding to the selected frequency mode currently set, and sets the read carrier frequency in the CONT 2.

[The Operation of the Present Synthesizer Module]

Next, the operation of the present synthesizer module will be described.

Before usage of the present synthesizer module, the external control apparatus 20 is connected to the synthesizer module by means of the serial bus 13, so that various parameters are set in the CPU 10 or the nonvolatile memory 12 of the present synthesizer module from the external control apparatus 20.

At this time, one of the frequency modes stored in the formula table is selected by the external control apparatus 20 to be set in the nonvolatile memory 12 as frequency mode information, and is retained as a "selected frequency mode" in a specific area in the nonvolatile memory 12. When setting of various parameters is completed, the external control apparatus 20 is disconnected from the synthesizer module.

Figure 4:
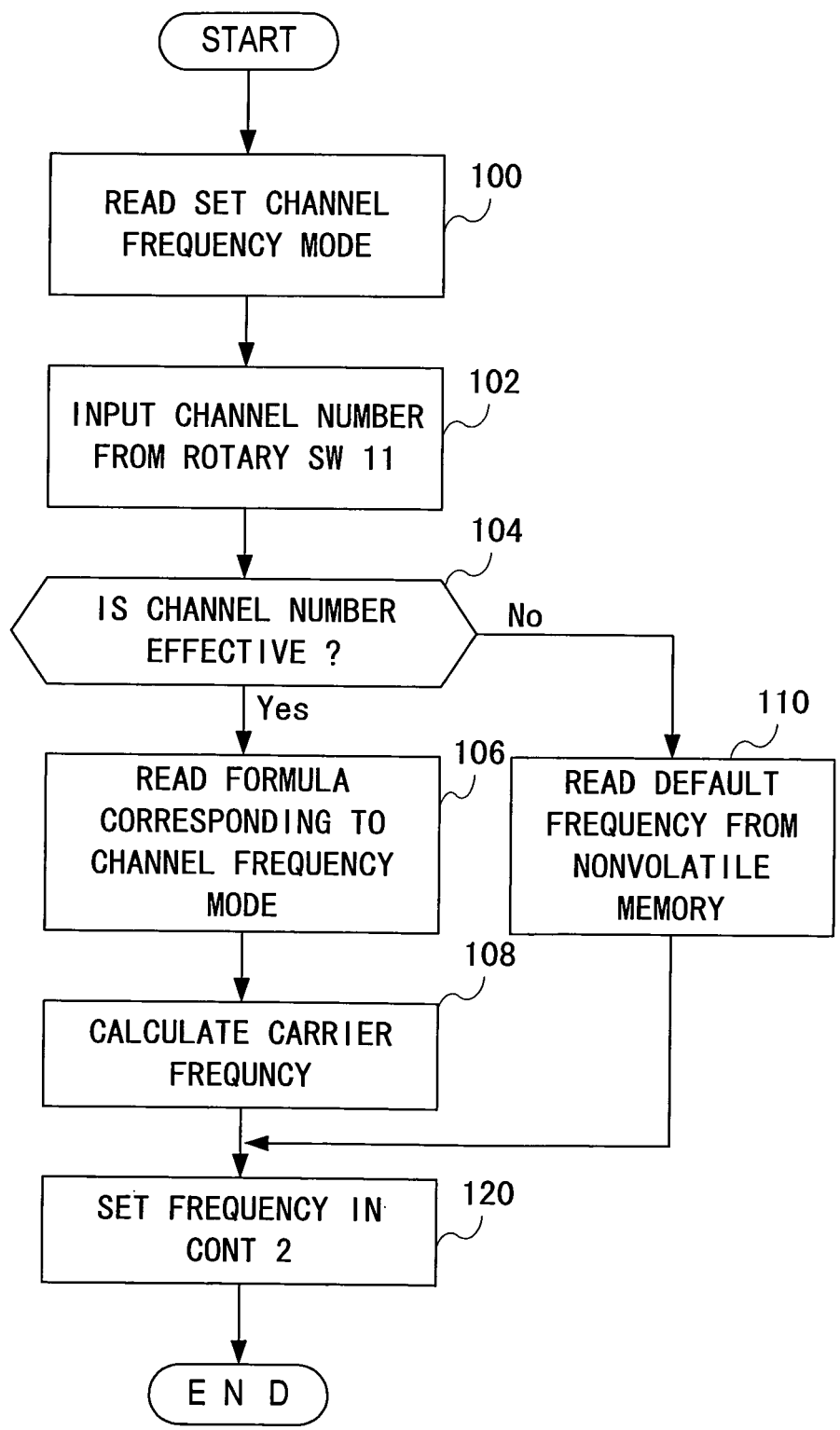
FIG. 4 is a flowchart illustrating the processing of CPU 10 at the time of setting a frequency in the present synthesizer module.

[The Operation Performed When Setting Frequency FIG. 4]

Next, the processes of the CPU 10 at the time of setting a frequency will be described by referring to FIG. 4. FIG. 4 is a flowchart illustrating the processing of the CPU 10 at the time of setting a frequency in the present synthesizer module.

As shown in FIG. 4, when the present synthesizer module is turned on by the power supply at the setting site thereof, the CPU 10 reads the set "selected frequency mode" from the specific area in the nonvolatile memory 12, and determines in which frequency mode the frequency setting is to be performed (Step 100).

Then, when a channel number is input through the rotary SW 11 by an operator's operation (Step 102), the CPU 10 determines whether or not the input channel number is effective in the currently set frequency mode by referring to the formula table (Step 104).

When the input channel number exists in an effective range, the CPU 10 reads a formula corresponding to the currently set frequency mode from the formula table in the nonvolatile memory 12 (Step 106), calculates a carrier frequency by setting the set channel number in the formula (Step 108), and sets the frequency in the CONT 2 (Step 120).

When the input channel number deviates from the effective range in process 104, the CPU 10 reads the default frequency from the nonvolatile memory 12 (Step 110), and sets the frequency in the CONT 2 (Step 120).

The operation of the present synthesizer module of setting the frequency is executed in this manner.

The Effect of the Embodiment

In accordance with the synthesizer module according to the embodiment of the present invention, a plurality of frequency modes and formulae for carrier frequencies corresponding thereto are stored in the formula table in the nonvolatile memory 12, and a frequency mode set at the time of initialization of the apparatus is stored in a specific area. Thus, when a channel number is input by means of the rotary SW 10 at the time of setting a frequency, the CPU 10 calculates a carrier frequency corresponding to the channel number from the formula corresponding to the currently set frequency mode, and sets the frequency in the CONT 2 of the PLL section. This brings about an effect such that if a frequency mode according to each destination area is set, it is possible to calculate a carrier frequency from a formula suitable for this area without changing the specifications of the apparatus for each destination area and set the carrier frequency in the PLL section to output an adequate frequency, thereby achieving reduction in the equipment cost, leading to shortening of the shipping or delivery period and promoting cost curtailment due to utilization of common parts in the maintenance of equipment.

In addition, according to the present synthesizer module, if a frequency mode corresponding to a destination area is set at the time of initializing the apparatus, a maintenance operator at the maintenance site can easily set a carrier frequency by merely setting a channel number with the rotary SW 11, thus facilitating the work of setting a frequency.

Further, according to the present synthesizer module, a previously set frequency or a predetermined frequency is stored in the nonvolatile memory 12 as a default frequency, and when a channel number set through the rotary SW 11 derives from the effective range, the CPU 10 outputs the default frequency to the CONT 2, so that even if a wrong channel number is set by the rotary SW 11, the standard frequency in the frequency mode can be set.

The present invention is suitable for a synthesizer module which can easily set an adequate oscillation frequency according to every area with common specifications, regardless of a destination area.

What is claimed is:

1. A synthesizer module comprising:
    a reference clock oscillation circuit configured to generate a reference clock;
    a voltage controlled oscillator;
    an amplifier which amplifies an output from the voltage controlled oscillator;
    a control section configured to generate a signal of a frequency set based on the reference clock, compare a phase of the generated signal of the set frequency with that of a signal input from the voltage controlled oscillator, and output a phase difference signal as a voltage value to the voltage controlled oscillator;
    a switch configured to set a channel number; and
    a central processing unit configured to output information on a frequency to be set to the control section,
    wherein the synthesizer module further comprises:
    a memory configured to store a plurality of frequency modes and frequency calculation formulae corresponding thereto and a frequency mode selected from outside, and
    wherein the central processing unit reads the selected frequency mode stored in the memory and a frequency calculation formula corresponding to the frequency mode, to calculate a value of the frequency corresponding to the channel number set by the switch based on the frequency calculation formula, and outputs the value to the control section.

2. The synthesizer module according to claim 1, wherein the memory stores a value of a specific frequency, and
    the central processing unit determines whether or not the channel number set by the switch falls within an effective range of a channel number corresponding to the selected frequency mode stored in the memory, reads, when the channel number deviates from the effective range, the value of the specific frequency from the memory and outputs the value to the control section, and reads, when the channel number is within the effective range, the selected frequency mode stored in the memory and a frequency calculation formula corresponding to the frequency mode, to calculate a value of the frequency corresponding to the channel number set by the switch based on the frequency calculation formula, and outputs the value to the control section.

3. The synthesizer module according to claim 1, wherein
    the central processing unit stores a value of a specific frequency and further, said central processing unit determines whether or not the channel number set by the switch falls within an effective range of a channel number corresponding to the selected frequency mode stored in the memory, outputs, when the channel number deviates from the effective range, a value of the specific frequency to the control section, and reads, when the channel number is within the effective range, the selected frequency mode stored in the memory and a frequency calculation formula corresponding to the frequency mode, to calculate a value of the frequency corresponding to the channel number set by the switch based on the frequency calculation formula, and outputs the value to the control section.

4. A synthesizer module comprising:
a reference clock oscillation circuit configured to generate a reference clock;
a voltage controlled oscillator;
an amplifier which amplifies an output from the voltage controlled oscillator;
a control section configured to generate a signal of a frequency set based on the reference clock, compare a phase of the generated signal of the set frequency with that of a signal input from the voltage controlled oscillator, and output a phase difference signal as a voltage value to the voltage controlled oscillator;
a switch configured to set a channel number; and
a central processing unit configured to output information on a frequency to be set to the control section, wherein the synthesizer module further comprises:
a table configured to store a channel number and a value of a frequency corresponding thereto for each of frequency modes of a plurality of channels; and
a memory configured to store a frequency mode selected from outside,
wherein the memory stores a value of a specific frequency, and
the central processing unit reads the selected frequency mode from the memory, determines whether or not the channel number falls within an effective range of a channel number corresponding to the selected frequency mode stored in the memory, and when the channel number is within the effective range, retrieves the table based on the frequency mode and the channel number to obtain a value of a corresponding frequency, and outputs the value to the control section, and when the channel number is out of the effective range, reads the value of the specific frequency from the memory and outputs the value to the control section.

* * * * *